(12) United States Patent
Adrian

(10) Patent No.: US 10,757,831 B2
(45) Date of Patent: Aug. 25, 2020

(54) APPARATUS, SYSTEM, AND METHOD FOR RECONFIGURING AIR FLOW THROUGH A CHASSIS

(71) Applicant: Facebook, Inc., Menlo Park, CA (US)

(72) Inventor: Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 69 days.

(21) Appl. No.: 15/716,251

(22) Filed: Sep. 26, 2017

(65) Prior Publication Data

US 2019/0098795 A1 Mar. 28, 2019

(51) Int. Cl.
*H05K 7/20* (2006.01)

(52) U.S. Cl.
CPC ..... *H05K 7/20145* (2013.01); *H05K 7/20718* (2013.01); *H05K 7/20727* (2013.01); *H05K 7/20181* (2013.01)

(58) Field of Classification Search
CPC ........... H05K 7/20145; H05K 7/20181; H05K 7/20718; H05K 7/20727
USPC ...................................... 165/96, 99, 104.33
See application file for complete search history.

(56) References Cited

U.S. PATENT DOCUMENTS

| | | |
|---|---|---|
| 294,800 A | 3/1884 | Madra |
| 355,538 A | 1/1887 | Keyes |
| 517,703 A | 4/1894 | Ludwig |
| 922,852 A | 5/1909 | Cannan |
| 1,062,733 A | 5/1913 | Rahotina |
| 1,516,692 A | 11/1924 | Andreas |
| 1,777,074 A | 9/1930 | Cordrey |
| 3,447,850 A | 6/1969 | Samson |
| 3,536,348 A | 10/1970 | Tedesco |
| 3,601,463 A | 8/1971 | Watt |
| 3,711,140 A | 1/1973 | Onori |
| 3,996,500 A | 12/1976 | Coules |
| 4,969,065 A | 11/1990 | Petri |
| 4,993,762 A | 2/1991 | Rogers et al. |
| 5,262,705 A | 11/1993 | Hattori |
| 5,281,149 A | 1/1994 | Petri |
| 5,724,803 A | 3/1998 | Pea |
| 5,793,614 A | 8/1998 | Tollbom |
| 5,957,659 A | 9/1999 | Amou |
| 6,021,044 A * | 2/2000 | Neville, Jr. ............... G06F 1/20 165/104.33 |
| 6,109,767 A | 8/2000 | Rodriguez |

(Continued)

OTHER PUBLICATIONS

Acoustic Attenuation; https://en.wikipedia.org/wiki/Acoustic_attenuation; Oct. 22, 2012.

(Continued)

*Primary Examiner* — Joel M Attey
(74) *Attorney, Agent, or Firm* — FisherBroyles, LLP

(57) ABSTRACT

A removable airflow control baffle may be dimensioned to be removably coupled to a receiving component that facilitates the flow of air through an enclosed container. Such an airflow control baffle may include (i) a support frame that is dimensioned to removably couple the airflow control baffle to the receiving component and (ii) an airflow control zone that is coupled to the support frame such that the airflow control zone affects airflow through an opening defined by the receiving component when the airflow control baffle is coupled to the receiving component.

20 Claims, 14 Drawing Sheets

(56) References Cited

U.S. PATENT DOCUMENTS

| | | | |
|---|---|---|---|
| 6,116,375 A | 9/2000 | Lorch | |
| 6,159,031 A | 12/2000 | Llapitan | |
| 6,181,549 B1 | 1/2001 | Mills | |
| 6,259,032 B1 | 7/2001 | Fernandez | |
| 6,260,441 B1 | 7/2001 | Landl | |
| 6,331,915 B1 | 12/2001 | Myers | |
| 6,373,707 B1 | 4/2002 | Hutchins | |
| 6,385,036 B1 | 5/2002 | Chien | |
| 6,385,051 B1 | 5/2002 | Perez et al. | |
| 6,404,646 B1 | 6/2002 | Tsai | |
| 6,469,899 B2 | 10/2002 | Hastings | |
| 6,515,854 B1 | 2/2003 | Claprood | |
| 6,535,394 B1 | 3/2003 | Hirzmann | |
| 6,552,915 B2 | 4/2003 | Takahashi et al. | |
| 6,556,433 B1 | 4/2003 | Love et al. | |
| 6,621,692 B1 | 9/2003 | Johnson | |
| 6,695,629 B1 | 2/2004 | Mayer | |
| 6,791,843 B1 | 9/2004 | Dobbs | |
| 6,798,669 B1 | 9/2004 | Hsu | |
| 6,813,165 B2 | 11/2004 | Cheng | |
| 6,921,227 B1 | 7/2005 | De Jong et al. | |
| 6,987,674 B2 | 1/2006 | El-Batal | |
| 6,992,885 B2 | 1/2006 | Wang | |
| 6,995,982 B2 | 2/2006 | Gonzalez | |
| 7,004,764 B2 | 2/2006 | Boudreau | |
| 7,084,654 B2 | 8/2006 | Zhao | |
| 7,085,131 B2 | 8/2006 | Peng et al. | |
| 7,088,579 B1 | 8/2006 | Konshak | |
| 7,167,371 B2 | 1/2007 | Coles | |
| 7,301,778 B1 | 11/2007 | Fang | |
| 7,304,855 B1 | 12/2007 | Milligan et al. | |
| 7,408,770 B2 | 8/2008 | Peng et al. | |
| 7,411,787 B2 | 8/2008 | Katakura | |
| 7,423,354 B2 | 9/2008 | Suzuki et al. | |
| 7,505,286 B2 | 3/2009 | Brovald | |
| 7,515,413 B1* | 4/2009 | Curtis | G06F 1/20 165/104.33 |
| 7,649,750 B2 | 1/2010 | Lee | |
| 7,826,208 B2 | 11/2010 | Wang et al. | |
| 8,020,902 B1 | 9/2011 | Li | |
| 8,127,059 B1 | 2/2012 | Carr et al. | |
| 8,203,851 B2 | 6/2012 | Boetzer | |
| 8,310,828 B2 | 11/2012 | Collins | |
| 8,331,095 B2 | 12/2012 | Hu et al. | |
| 8,369,080 B2 | 2/2013 | Huang | |
| 8,517,054 B2* | 8/2013 | Lai | H05K 7/20727 137/625.3 |
| 8,570,720 B2 | 10/2013 | Yao | |
| 8,636,528 B2 | 1/2014 | Sass et al. | |
| 8,657,619 B2 | 2/2014 | Lin | |
| 8,743,549 B2 | 6/2014 | Frink et al. | |
| 8,749,966 B1 | 6/2014 | Boudreau | |
| 8,770,681 B2 | 7/2014 | Hu | |
| 8,848,349 B2 | 9/2014 | Ke | |
| 8,944,538 B2 | 2/2015 | Li | |
| 8,971,052 B2 | 3/2015 | Fu | |
| 9,066,438 B2 | 6/2015 | Chen | |
| 9,070,419 B1 | 6/2015 | Zhu | |
| 9,098,233 B2 | 8/2015 | Keffeler | |
| 9,101,210 B2 | 8/2015 | Lin | |
| 9,203,188 B1 | 12/2015 | Siechen | |
| 9,274,548 B2 | 3/2016 | Foisy et al. | |
| 9,298,230 B2 | 3/2016 | Wei | |
| 9,313,909 B1 | 4/2016 | Huang | |
| 9,354,003 B2 | 5/2016 | Lin | |
| 9,448,601 B1 | 9/2016 | Beall et al. | |
| 9,454,190 B2 | 9/2016 | Mao et al. | |
| 9,456,519 B2 | 9/2016 | Bailey | |
| 9,461,389 B2 | 10/2016 | Novack | |
| 9,474,190 B1 | 10/2016 | Beall et al. | |
| 9,538,684 B2 | 1/2017 | Chen | |
| 9,545,028 B2 | 1/2017 | Hoshino | |
| 9,572,276 B2 | 2/2017 | Haroun | |
| 9,583,877 B1 | 2/2017 | Angelucci | |
| 9,609,778 B1 | 3/2017 | Spencer | |
| 9,763,350 B2 | 9/2017 | Rust | |
| 9,763,353 B1 | 9/2017 | Beall | |
| 9,795,052 B2 | 10/2017 | Hsiao | |
| 9,936,611 B1 | 4/2018 | Beall et al. | |
| 9,949,407 B1 | 4/2018 | Beall | |
| 10,058,006 B2 | 8/2018 | Hung et al. | |
| 10,165,703 B1 | 12/2018 | Adrian | |
| 10,178,791 B1 | 1/2019 | Kho | |
| 10,240,615 B1 | 3/2019 | Kho et al. | |
| 10,264,698 B2 | 4/2019 | Kho et al. | |
| 10,354,699 B1 | 7/2019 | Gopalakrishna et al. | |
| 10,372,360 B2 | 8/2019 | Adrian | |
| 2003/0112594 A1 | 6/2003 | Smith | |
| 2003/0123221 A1 | 7/2003 | Liao | |
| 2003/0183448 A1 | 10/2003 | Van Sleet | |
| 2003/0200472 A1 | 10/2003 | Midorikawa et al. | |
| 2003/0200475 A1 | 10/2003 | Komoto | |
| 2004/0052046 A1 | 3/2004 | Regimbal et al. | |
| 2004/0227443 A1 | 11/2004 | Sandoval | |
| 2005/0057909 A1 | 3/2005 | El-Batal et al. | |
| 2005/0136747 A1 | 6/2005 | Caveney et al. | |
| 2005/0162099 A1* | 7/2005 | Kemper | G01K 1/02 315/291 |
| 2005/0182874 A1 | 8/2005 | Herz et al. | |
| 2005/0238421 A1 | 10/2005 | Doerr | |
| 2006/0075155 A1 | 4/2006 | Fuller et al. | |
| 2006/0134953 A1 | 6/2006 | Williams | |
| 2006/0146507 A1 | 7/2006 | Lee | |
| 2006/0198097 A1 | 9/2006 | Kuwajima et al. | |
| 2006/0274508 A1 | 12/2006 | Lariviere | |
| 2007/0195542 A1 | 8/2007 | Metros | |
| 2007/0230111 A1 | 10/2007 | Starr | |
| 2007/0233781 A1 | 10/2007 | Starr | |
| 2007/0234081 A1 | 10/2007 | Makino et al. | |
| 2008/0007913 A1 | 1/2008 | Tavassoli | |
| 2008/0117569 A1 | 5/2008 | Lee | |
| 2008/0174949 A1 | 7/2008 | Lai et al. | |
| 2008/0195786 A1 | 8/2008 | Lee | |
| 2008/0239650 A1 | 10/2008 | Fujie et al. | |
| 2008/0264192 A1 | 10/2008 | Christensen | |
| 2009/0245745 A1 | 10/2009 | Krampotich | |
| 2009/0271950 A1 | 11/2009 | Wang | |
| 2009/0274429 A1 | 11/2009 | Krampotich | |
| 2009/0310303 A1 | 12/2009 | Najbert | |
| 2010/0153608 A1 | 6/2010 | Olesiewicz et al. | |
| 2010/0195304 A1 | 8/2010 | Takao | |
| 2010/0296791 A1 | 11/2010 | Makrides-Saravanos | |
| 2011/0208937 A1 | 8/2011 | Hayashi et al. | |
| 2011/0273850 A1 | 11/2011 | Chen | |
| 2011/0299237 A1 | 12/2011 | Liang | |
| 2011/0309730 A1 | 12/2011 | Retchloff | |
| 2012/0004772 A1 | 1/2012 | Rahilly | |
| 2012/0020006 A1* | 1/2012 | Xu | G06F 1/186 361/679.33 |
| 2012/0134086 A1 | 5/2012 | Zhang | |
| 2012/0230815 A1 | 9/2012 | Teramoto | |
| 2012/0243170 A1 | 9/2012 | Frink et al. | |
| 2012/0257360 A1 | 10/2012 | Sun | |
| 2012/0305745 A1 | 12/2012 | Chen | |
| 2012/0320519 A1 | 12/2012 | Wu et al. | |
| 2013/0050955 A1 | 2/2013 | Shinsato et al. | |
| 2013/0058054 A1 | 3/2013 | Zhou | |
| 2013/0162127 A1 | 6/2013 | Hu | |
| 2013/0258580 A1 | 10/2013 | Nakayama | |
| 2013/0325183 A1 | 12/2013 | Rahilly | |
| 2014/0111930 A1 | 4/2014 | Henderson | |
| 2014/0118936 A1* | 5/2014 | Merlet | H05K 7/20563 361/694 |
| 2014/0187068 A1 | 7/2014 | Chia | |
| 2014/0191636 A1 | 7/2014 | Li | |
| 2014/0203696 A1* | 7/2014 | Rust | G11B 33/02 312/330.1 |
| 2014/0247569 A1 | 9/2014 | Foisy et al. | |
| 2014/0362521 A1* | 12/2014 | Pronozuk | H05K 7/20836 361/679.47 |
| 2014/0369002 A1 | 12/2014 | Takeuchi | |
| 2015/0156912 A1 | 6/2015 | Liang | |
| 2015/0163946 A1 | 6/2015 | Kyle | |
| 2015/0208548 A1 | 7/2015 | Chu | |

(56) References Cited

U.S. PATENT DOCUMENTS

| | | | |
|---|---|---|---|
| 2015/0235673 A1 | 8/2015 | Lo | |
| 2015/0320204 A1 | 11/2015 | Byrne et al. | |
| 2015/0380059 A1 | 12/2015 | Bell et al. | |
| 2016/0018859 A1 | 1/2016 | Mao et al. | |
| 2016/0042768 A1 | 2/2016 | Yang et al. | |
| 2016/0150659 A1 | 5/2016 | Chen | |
| 2016/0150667 A1 | 5/2016 | Xu | |
| 2016/0330858 A1 | 11/2016 | Ehlen | |
| 2016/0381824 A1 | 12/2016 | Chu | |
| 2017/0325361 A1 | 11/2017 | Chen et al. | |
| 2018/0027059 A1* | 1/2018 | Miller | H04L 49/45 709/201 |
| 2018/0168071 A1* | 6/2018 | Edge | H05K 7/20745 |
| 2018/0260349 A1 | 9/2018 | Mondal et al. | |
| 2019/0069432 A1 | 2/2019 | Kho et al. | |
| 2019/0069437 A1 | 2/2019 | Adrian et al. | |
| 2019/0069440 A1 | 2/2019 | Adrian | |
| 2019/0073008 A1 | 3/2019 | Adrian | |
| 2019/0075668 A1 | 3/2019 | Adrian et al. | |
| 2019/0079565 A1 | 3/2019 | Adrian | |
| 2019/0090374 A1 | 3/2019 | Kho et al. | |
| 2019/0090376 A1 | 3/2019 | Kho et al. | |

OTHER PUBLICATIONS

Electromagnetic Shielding; https://en.wikipedia.org/wiki/Electromagnetic_shielding; May 15, 2016.

Jason David Adrian et al.; Apparatus, System, and Method for Reconfigurable Media-Agnostic Storage; U.S. Appl. No. 15/694,068; filed Sep. 1, 2017.

Jason David Adrian; Apparatus, System, and Method for Indicating the Status of and Securing Hard Drives; U.S. Appl. No. 15/700,112; filed Sep. 9, 2017.

Jason David Adrian; Apparatus, System, and Method for Directing Air in a Storage-System Chassis; U.S. Appl. No. 15/689,650; filed Aug. 29, 2017.

Jason David Adrian et al.; Apparatus, System, and Method for Enabling Multiple Storage-System Configurations; U.S. Appl. No. 15/688,830; filed Aug. 28, 2017.

Jason David Adrian et al.; Apparatus, System, and Method for Securing Hard Drives in a Storage Chassis; U.S. Appl. No. 15/697,405; filed Sep. 6, 2017.

Jason David Adrian; Apparatus, System, and Method for Detecting Device Types of Storage Devices; U.S. Appl. No. 15/698,540; filed Sep. 7, 2017.

Chuankeat Kho et al.; Removeable Drive-Plane Apparatus, System, and Method; U.S. Appl. No. 15/693,362; filed Aug. 31, 2017.

Chuankeat Kho et al.; Systems and Methods for Mounting Assembly Pull-Handles; U.S. Appl. No. 15/687,406; filed Aug. 25, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Open Compute Project; http://opencompute.org/; as accessed Sep. 29, 2017.

Jason David Adrian; Data-Center Drawer and Cable Track Assembly; U.S. Appl. No. 15/720,647; filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607; filed Sep. 23, 2017.

Chuankeat Kho et al.; Apparatus, System, and Method for Partitioning a Storage-System Chassis; U.S. Appl. No. 15/708,069; filed Sep. 18, 2017.

Chuankeat Kho et al.; Apparatus, System, and Method for Dampening Vibrations Generated by Exhaust Fans; U.S. Appl. No. 15/713,609; filed Sep. 23, 2017.

Chuankeat Kho et al.; Apparatus, System, and Method for Resisting Shock to a Data-Center Rack; U.S. Appl. No. 15/708,075; filed Sep. 18, 2017.

* cited by examiner

APPARATUS, SYSTEM, AND METHOD FOR RECONFIGURING AIR FLOW THROUGH A CHASSIS

BACKGROUND

Data storage centers and other systems that manage large numbers of electronics devices may use a variety of hardware to support the involved electronics. For example, a data storage center may store hard drive arrays in ventilated drawers for ease of use and maintenance. Each ventilated drawer may include a chassis that provides structural support for various hard drives, control boards, and other electronics, as well as mechanisms to keep the components stored in the drawer from overheating. One such cooling method includes using fans to move air through the interior of the chassis, with cut out portions of the chassis enabling air to flow to various areas.

Unfortunately, a given item of conventional storage hardware may be designed for a specific use-case, rendering it unsuitable for other storage modes. For example, a chassis for a data-storage system arranged for warm storage may be configured in a way that makes that chassis unsuitable for, say, a cold storage configuration. Converting a warm storage chassis to a cold storage chassis may require significant time, labor, and/or materials. Data-center administrators may opt to simply stock extra hardware to ensure that replacement hardware is readily available. Unfortunately, conventional ventilated drawers may be designed for a single purpose, and may not be easily reconfigured for use in other contexts. Such inflexibility may require administrators to stock replacements for each configuration used in their systems. The instant disclosure, therefore, identifies and addresses a need for improved apparatuses, systems, and methods for rapidly converting the configuration of a chassis from one form to another.

SUMMARY

As will be described in greater detail below, the instant disclosure describes various apparatuses, systems, and methods for using a removable airflow control baffle to reconfigure a chassis. Removable airflow control baffles may enable reconfiguration of enclosed ventilated containers (such as drawers), thereby enabling a single chassis to be used for a variety of purposes, depending on the installed baffles.

In one example, a removable airflow control baffle may be dimensioned to be removably coupled to a receiving component that facilitates the flow of air through an enclosed container. This airflow control baffle may include (i) a support frame that is dimensioned to removably couple the airflow control baffle to the receiving component, and (ii) an airflow control zone that is coupled to the support frame such that the airflow control zone affects airflow through an opening defined by the receiving component when the airflow control baffle is coupled to the receiving component.

The airflow control baffle may include visual features that identify the configuration of the airflow control baffle. For example, the airflow control baffle may include colored material that forms the support frame and airflow control zone. This colored material may be associated with the configuration of the airflow control zone.

The airflow control zone may be configured in a variety of ways. In some embodiments, the airflow control zone may include a repeating mesh pattern that is patterned to permit air to flow through the airflow control zone. Furthermore, the repeating mesh pattern may be patterned to reduce electromagnetic interference caused by the airflow control baffle.

In some examples, the airflow control zone may be configured to partially occlude the opening defined by the receiving component, thereby restricting airflow through the opening defined by the receiving component. Alternatively, the airflow control zone may be configured to completely occlude the opening defined by the receiving component, thereby preventing airflow through the opening defined by the receiving component.

The receiving component may include a variety of features. In some embodiments, the receiving component may include a receiving slot that is dimensioned to define the opening, and may also be dimensioned to removably hold the airflow control baffle within the opening. This receiving slot may be substantially rectangular in shape. In these embodiments, the airflow control baffle may form a substantially rectangular shape that enables the airflow control baffle to be removably inserted into the receiving slot.

Furthermore, the receiving component may include at least one spring clip socket. In these examples, the support frame may include a spring clip that removably couples to the spring clip socket.

The airflow control baffle may include other features to enhance the functionality of the airflow control baffle. For example, the airflow control baffle may include a cushioning material that is coupled to the support frame and cushions the airflow control baffle against contact with the receiving component. Additionally or alternatively, the airflow control baffle may include a sealing material that forms a seal between the support frame and the receiving component while the airflow control baffle is coupled to the receiving component.

A system incorporating the above-described airflow control baffle may include an enclosed container that permits airflow through the interior of the enclosed container. The system may also include an airflow control baffle that includes (i) a support frame, and (ii) an airflow control zone coupled to the support frame. The system may further include a receiving component that is coupled to the enclosed container and facilitates airflow through the interior of the enclosed container. This receiving component may (i) define an airflow opening that permits air to flow through the receiving component, and (ii) be dimensioned to receive the airflow control baffle such that the airflow control baffle is positioned to affect the flow of air through the airflow opening. In some embodiments, the receiving component may facilitate the flow of air between the exterior of the enclosed container and the interior of the enclosed container.

In some embodiments, the receiving component of the system may include a baffle slot that (i) is dimensioned to removably receive the airflow control baffle, and (ii) is positioned to hold the airflow control baffle such that the airflow control baffle affects the flow of air through the airflow opening.

In some embodiments, the baffle slot may include a receiving slot cover that secures the airflow control baffle within the baffle slot. The receiving slot cover may include (i) a plate section that physically obstructs the baffle slot, thereby preventing objects from being inserted into the baffle slot and preventing objects from being removed from the baffle slot, when the receiving slot cover is in a closed position, (ii) a hinge, coupled to one end of the plate section, that couples the receiving slot cover to the receiving component and permits the receiving slot cover to change positions between the closed position and an open position, and (iii) a latch section that physically and removably couples to the receiving component, thereby holding the receiving slot cover in the closed position when the latch section is coupled to the receiving component.

The enclosed container may take a variety of forms. In some embodiments, the enclosed container may include a ventilated drawer that includes ventilation fans to facilitate the flow of air through the enclosed container.

A method for using the above-described airflow control baffle and corresponding system may include unfastening a first airflow control baffle from a receiving component of an enclosed container. The receiving component may be coupled to the enclosed container such that objects coupled to the receiving component affect airflow through at least a portion of the enclosed container, and the first airflow control baffle may originally be removably coupled to the receiving component. Once the first airflow control baffle has been unfastened, the method may include removing the first airflow control baffle from the receiving component, then coupling a second airflow control baffle to the receiving component such that the second airflow control baffle is removably coupled to the receiving component and affects airflow through the portion of the enclosed container.

In embodiments where the airflow control baffle includes spring fasteners, unfastening the first airflow control baffle from the receiving component may include manipulating a first set of spring fasteners that are coupled to the first airflow control baffle until the first set of spring fasteners disengages from a fastener receiving component of the receiving component. In these embodiments, coupling the second airflow control baffle to the receiving component may include pressing the second airflow control baffle into the receiving component until a set of spring fasteners coupled to the second airflow control baffle engage with the fastener receiving component.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
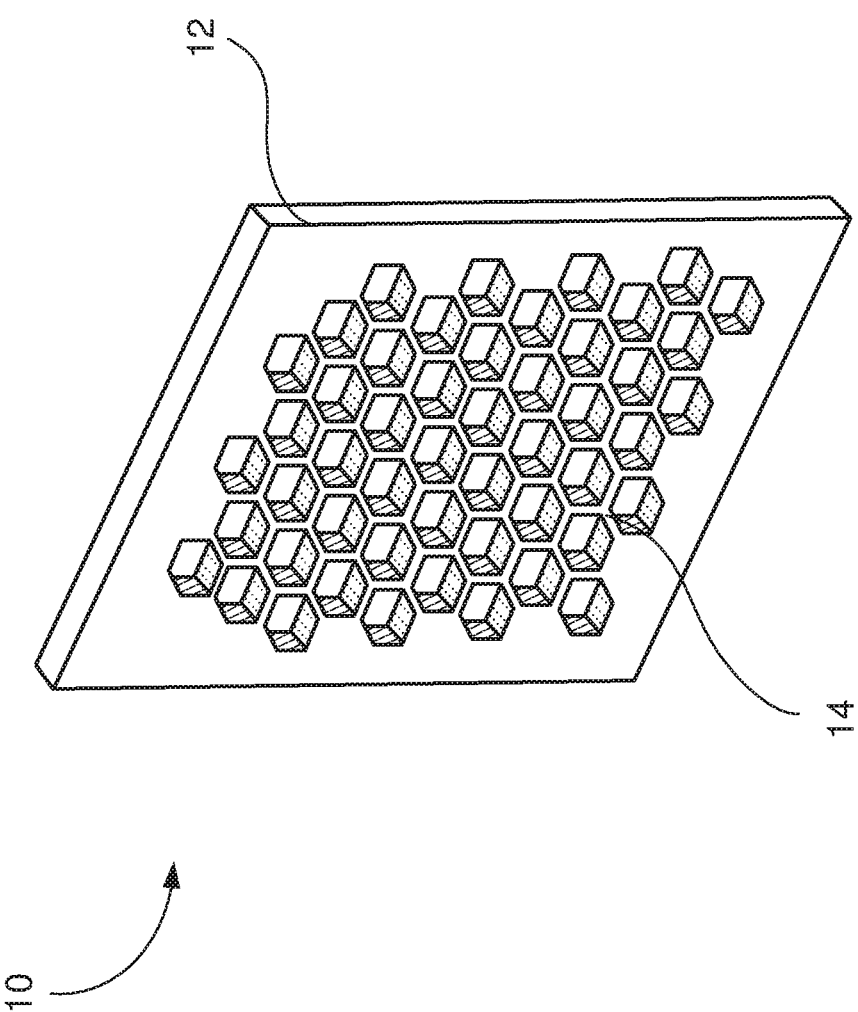
FIG. 1 is a schematic diagram of a rectangle-shaped removable airflow control baffle.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed towards a removable airflow control baffle that enables users and/or administrators to reconfigure a chassis. As will be explained in greater detail below, embodiments of the instant disclosure may enable administrators or other users of a storage system to quickly and efficiently alter the airflow configuration of an enclosed container. Administrators of data-storage hardware may exchange the removable airflow control baffles installed in a chassis with other baffles to quickly and efficiently alter the airflow pattern of the interior of a ventilated drawer depending on the contents of the ventilated drawer. Moreover, the receiving hardware that holds the airflow control baffles in place may allow users to reconfigure storage space without removing drawers from their support racks. Because each drawer may be configurable for a variety of purposes, administrators may be able to maintain a smaller inventory of spare drawers; a spare drawer may be configured to replace any other drawer, provided that it is equipped with the proper configuration of airflow control baffles. By enabling users to configure and reconfigure airflow patterns of ventilated drawers in this way, the apparatuses, systems, and methods described herein may reduce time spent on maintaining data-storage hardware and/or reduce the number of spare drawers data-center administrators must keep on hand to ensure that the system operates at peak efficiency.

The following will provide, with reference to FIG. 1 detailed descriptions of an example airflow control baffle. Detailed descriptions of the airflow control baffle and an example receiving slot will be provided in connection with FIGS. 2-8. Detailed descriptions of an additional example airflow control baffle will be provided in connection with FIGS. 9-11, and detailed descriptions of ventilated drawers that utilize removable airflow control baffles will be provided in connection with FIGS. 12-14.

FIG. 1 is a schematic diagram of an example airflow control baffle 10. As illustrated in FIG. 1, airflow control baffle 10 may include a support frame 12 and an airflow control zone 14. Support frame 12 may provide structural support for airflow control zone 14. Furthermore, support frame 12 may include a variety of features that enable airflow control baffle 10 to be removably coupled to a receiving component, as will be described in greater detail below.

Airflow control baffle 10 may be formed from a variety of materials. In some embodiments, some or all of airflow control baffle 10 may be formed from any of a variety of metals, plastics, laminates, resins, rubbers, composite materials, and/or any other material of sufficient structure to affect airflow through an opening. Furthermore, airflow control baffle 10 may be formed using a variety of techniques, such as injection molding, thermoforming, die-casting, cutting, lamination, extrusion, co-extrusion, and/or any other suitable technique of creating a perforated zone held in place by a support structure. In some embodiments, support frame 12 and airflow control zone 14 may be formed out of the same material. For example, support frame 12 and airflow control zone 14 may be formed from a cast of a single injection mold, or die-cut from a single uniform sheet of material. Alternatively, support frame 12 and airflow control zone may be formed separately, then joined together. For example, support frame 12 may be formed from a plastic injection molding process and airflow control zone 14 may be formed by die-cutting a sheet of aluminum. These pieces may then be fastened together with screws, pins, glues, and/or any other suitable means of fastening two objects together. The above-described techniques are merely provided as examples to illustrate certain methods by which airflow control baffle 10 may be manufactured, as any suitable manufacturing technique and/or techniques may be used to create airflow control baffle 10.

Furthermore, the materials that make up airflow control baffle 10 may be colored, and the color of airflow control baffle 10 may correspond to a configuration of airflow control zone 14. For example, all or a portion of airflow control baffle 10 may be painted, dyed, tinted, or otherwise colored to indicate the configuration of airflow control zone 14. For example, an airflow control baffle that is colored orange may correspond to a configuration that is suitable for a "warm" or "hot" data-storage system, while an airflow control baffle that is colored blue may correspond to a configuration suitable for use in a "cold" data-storage system. Similarly, different colors may correspond to various versions for the configurations. For example, an orange airflow control baffle may correspond to a first version for a configuration of the "warm" data-storage configuration, while a yellow baffle corresponds to a later version of the "warm" data-storage configuration. Detailed examples of configurations for airflow control zone 14 will be described in greater detail below.

In the example of FIG. 1, airflow control baffle 10 is substantially rectangular in shape, although airflow control baffle 10 may form any suitable shape for controlling the flow of air through an opening. For example, airflow control baffle 10 may form a circle, oval, irregular shape, composite shape, and/or any other suitable shape that allows airflow control baffle 10 to modify airflow through a corresponding opening. Regardless of the exact shape of airflow control baffle 10, the shape of the airflow control baffle may correspond to the shape of the opening.

Figure 2:
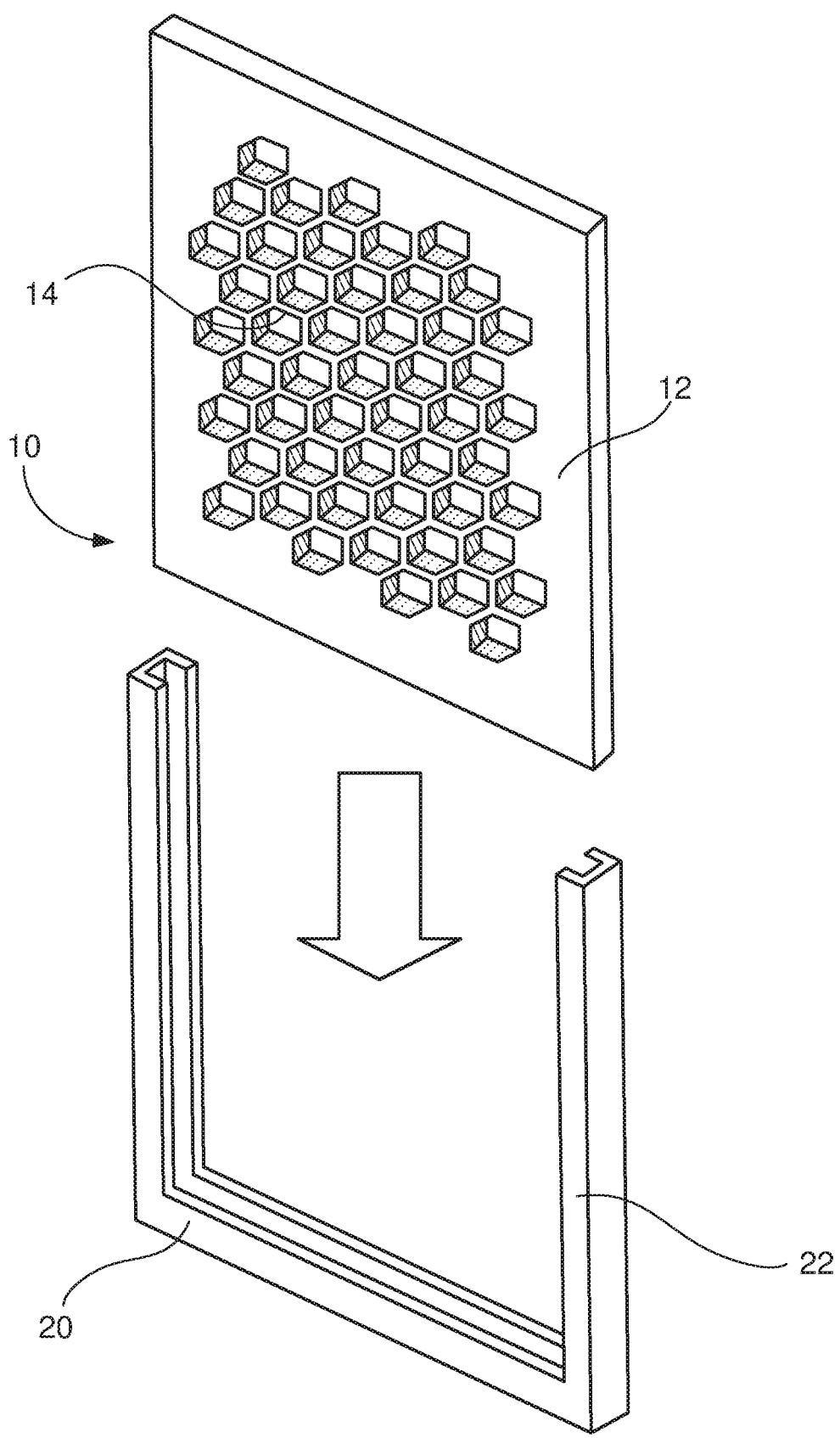
FIG. 2 is a schematic diagram of a removable airflow control baffle positioned for insertion into a receiving slot.

In some embodiments, airflow control baffle 10 may be removably inserted into a receiving component. The receiving component may include a receiving slot that defines an opening and is shaped to removably hold the airflow control baffle within the opening. FIG. 2 is a schematic diagram of the above-described airflow control baffle positioned for insertion into a receiving component. In general, receiving component 20 may be designed to hold airflow control baffle 10 in place such that airflow control zone 14 is positioned to affect the flow of air through an opening 22 that is defined by receiving component 20. Furthermore, receiving component 20 may be constructed so that airflow control baffle 10 may be readily decoupled from receiving component 20. For example, a receiving component for a substantially rectangular airflow control baffle may likewise form a substantially rectangular shape, thereby allowing the airflow control baffle to be removably inserted into the receiving component.

As shown in FIG. 2, airflow control baffle 10 may be dimensioned to fit within a rectangular receiving component 20 by sliding airflow control baffle 10 into receiving component 20 in the direction shown by the large arrow. Receiving component 20 may define opening 22, and the structure of receiving component 20 may be constructed in such a way to hold airflow control baffle 10 such that airflow control zone 14 of airflow control baffle 10 fills opening 22. The corresponding shapes of airflow control baffle 10 and receiving component 20 may be configured such that airflow control baffle 10 may be readily inserted into or removed from receiving component 20.

Receiving component 20 may include a variety of features. In the example of FIG. 2, receiving component 20 is constructed from a c-channel that surrounds opening 22 on three sides. The fourth side may be left open to allow a user to insert airflow control baffle 10 into receiving component 20. The c-channel of receiving component 20 may contact and physically hold support frame 12, thereby holding airflow control zone 14 within opening 22. As with airflow control baffle 10, receiving component 20 may be constructed out of any suitable material or combination of materials according to any suitable manufacturing technique. For example, receiving component 20 may be crafted out of segments of folded aluminum.

Although this example shows receiving component 20 as constructed out of a c-channel, receiving component 20 may adopt a variety of forms and/or configurations depending on context. In some embodiments, receiving component 20 may include two parallel c-channels and a bottom stop. In embodiments where receiving component 20 is a non-integral component, receiving component 20 may be fastened to support structures (e.g., a wall of an enclosed container). In further embodiments, receiving component 20 may be an integral part of a container. For example, receiving component 20 may be carved out of or otherwise formed from the structure of a wall of an enclosed container.

Moreover, receiving component 20 may include visual indicators, such as colored materials visible on the exterior surface of receiving component 20, that indicate the configuration of receiving component 20. For example, a receiving component that accepts a particular shape of baffle may be colored blue while a receiving component that accepts a different shape of baffle may be colored green. The visual indicators of a given receiving component may enable end users to readily identify an appropriate airflow control baffle that is configured for use with that specific receiving component.

Figure 3:
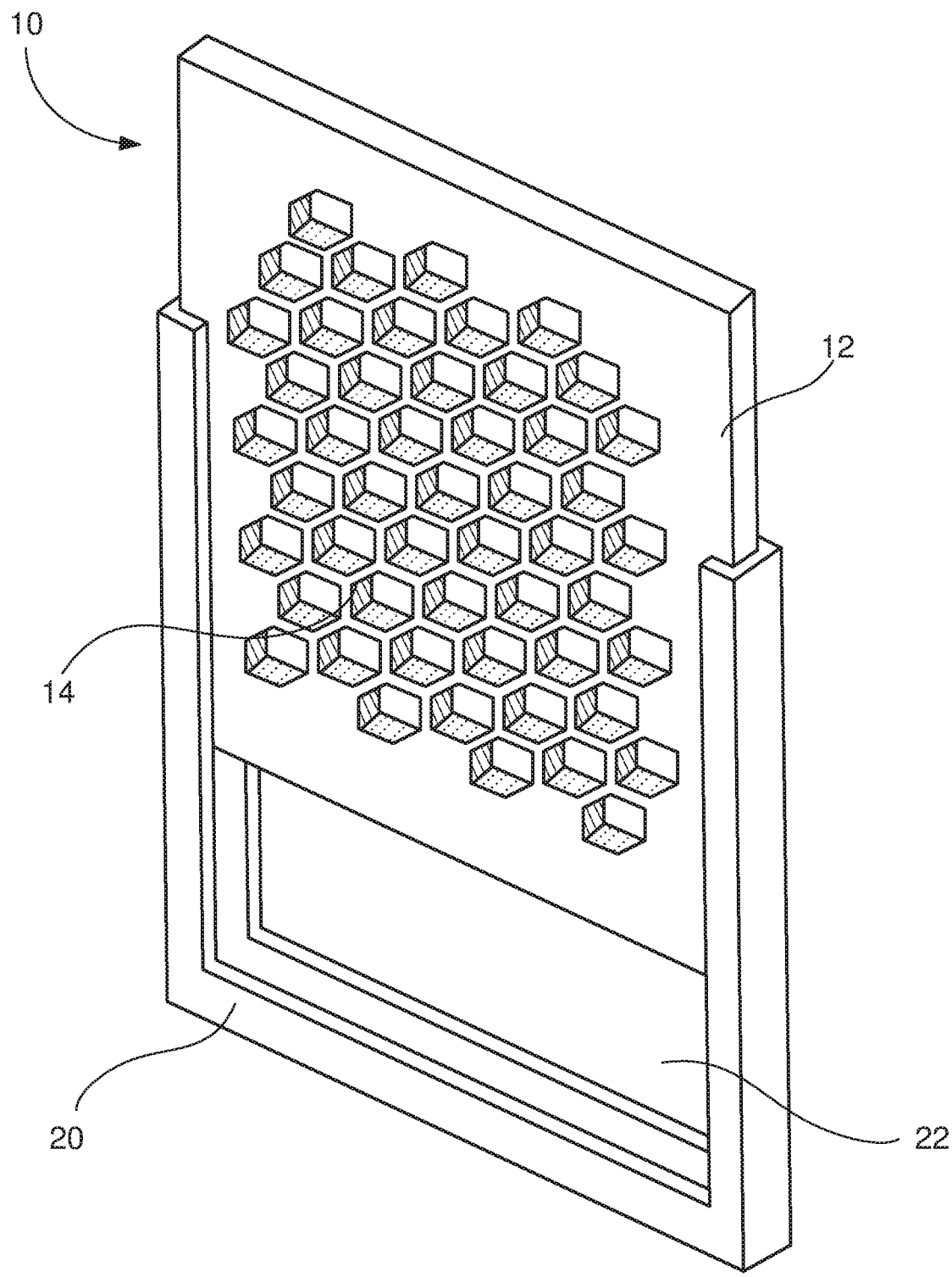
FIG. 3 is a schematic diagram of the removable airflow control baffle and receiving slot of FIG. 2, with the removable airflow control baffle being partially inserted into the receiving slot.

Airflow control baffle 10 may, by way of support frame 12, be removably coupled to receiving component 20. As shown in FIG. 3, airflow control baffle 10 may be inserted into the framework of receiving component 20. In this example, the shape of support frame 12 is configured to fit within the c-channel of receiving component 20. In the illustrated embodiment, the shape of support frame 12 may be configured such that support frame 12 inserts snugly into receiving component 20. Airflow control baffle 10 may then be installed by fully inserting it into receiving component 20 such that airflow control zone 14 occupies opening 22.

Figure 4:
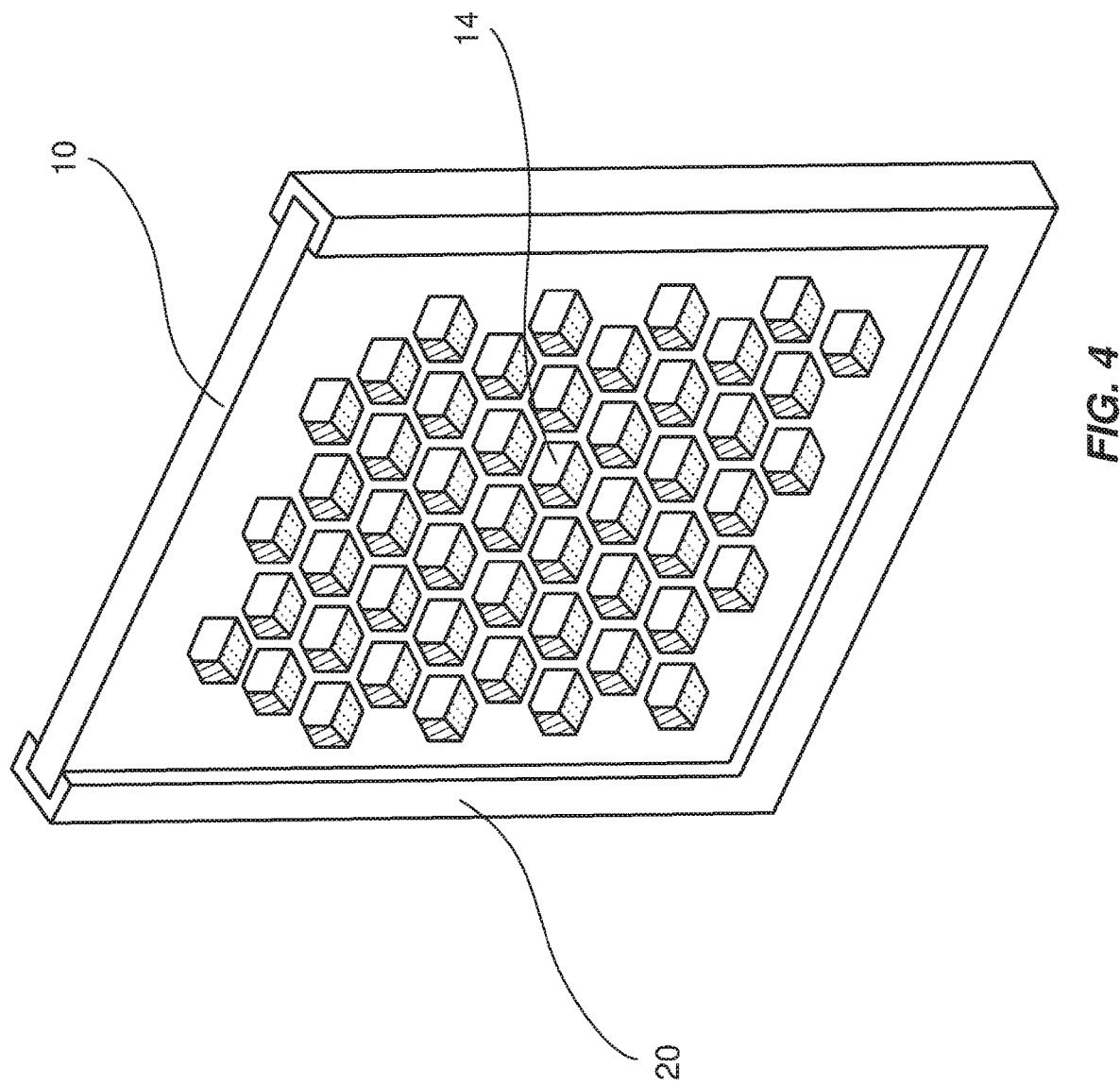
FIG. 4 is a schematic diagram of the removable airflow control baffle and receiving slot of FIG. 2, with the removable airflow control baffle being fully inserted into the receiving slot.

FIG. 4 is a schematic diagram showing airflow control baffle 10 fully inserted into receiving component 20. Once airflow control baffle 10 has been fully inserted into receiving component 20 as illustrated in FIG. 4, the positioning of support frame 12, airflow control zone 14, and receiving component 20 are such that airflow control zone 14 fills or otherwise covers opening 22. In the example illustrated here, the rectangular shape of airflow control baffle 10 is designed to fill the corresponding rectangular opening defined by receiving component 20, thereby allowing airflow control baffle 10 to control the flow of air through the opening defined by receiving component 20. Airflow control baffle 10 may later be removed from receiving component 20 by reversing the process illustrated in FIGS. 2-4.

Figure 5:
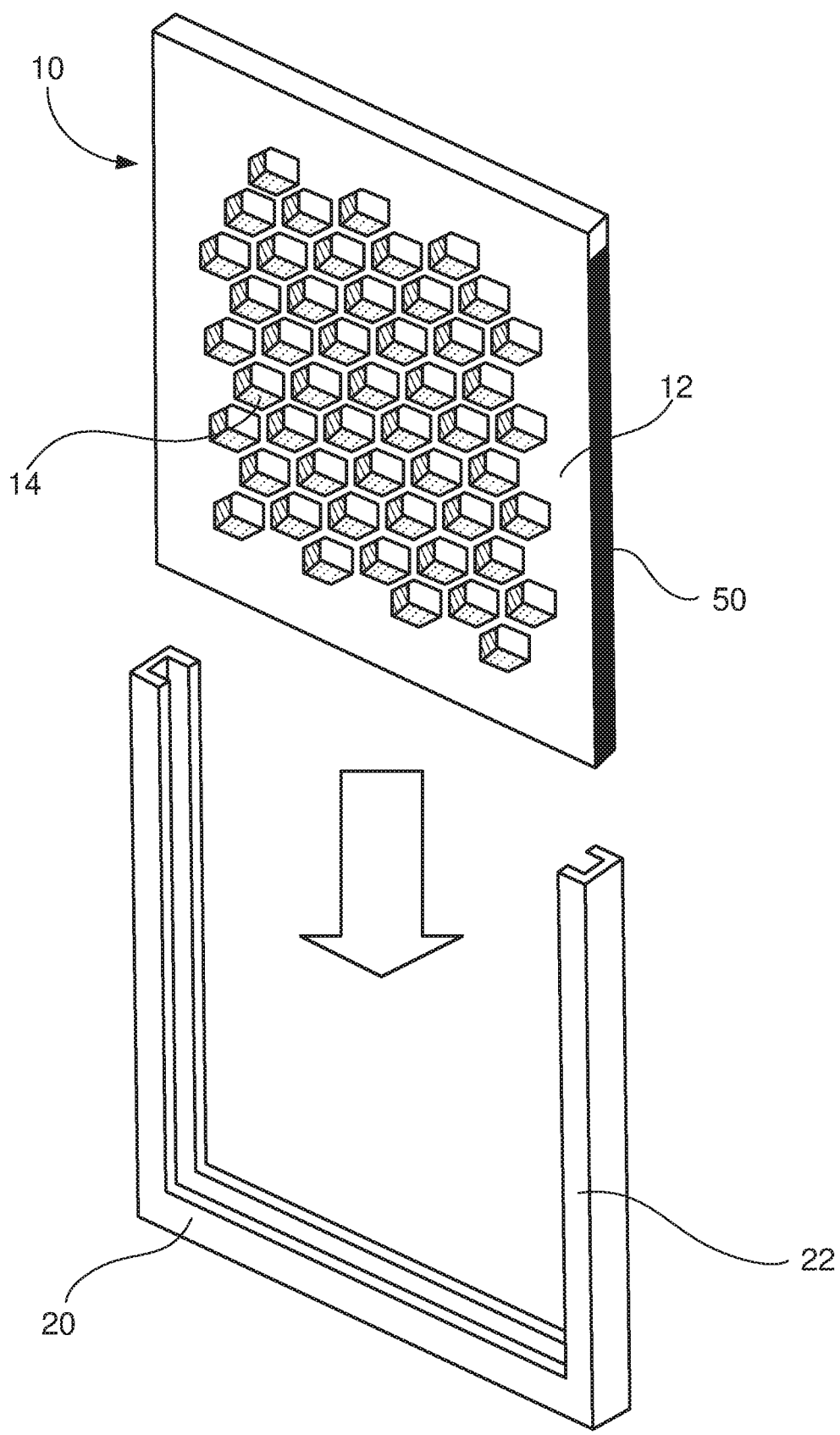
FIG. 5 is a schematic diagram of the airflow control baffle and receiving slot of FIG. 2, where the airflow control baffle includes a cushioning material.

Airflow control baffle 10 may include additional features that cushion, insulate, and/or seal airflow control baffle 10 against receiving component 20. As illustrated in FIG. 5, airflow control baffle 10 may include additional material on the outermost edge of support frame 12, illustrated as material 50. Material 50 may provide a variety of functions, including but not limited to dampening vibrations that would cause airflow control baffle 10 to vibrate within receiving component 20, forming a seal between support frame 12 and receiving component 20 to ensure that airflow control zone 14 is able to properly control the flow of air through opening 22, providing a cushion between airflow control baffle 10 and receiving component 20 to minimize wear and tear, etc. Although these functions are described separately, certain compositions and/or arrangements of material 50 may provide multiple functions. For example, a rubber material applied to the outer edge of support frame 12 may seal airflow control baffle 10 against receiving component 20 as well as dampen vibrations that would cause airflow control baffle 10 to rattle against receiving component 20. In some embodiments that are not illustrated here, material 50 may wrap around the edge of support frame 12 to achieve the desired function.

Material 50 may be constructed out of any suitable material for providing dampening, sealing, and/or cushioning functions. For example, material 50 may include foams, rubbers, gels, and/or any other suitable material. Material 50 may also be secured to support frame 12 using any suitable fastening, such as glues, epoxies, pins, nails, rivets, combinations of one or more of the same, and/or any other suitable mode of fastening one object to another.

Furthermore, airflow control baffle 10 and/or receiving component 20 may include features that removably secure airflow control baffle 10 to receiving component 20. In some embodiments and as will be described further below, airflow control baffle 10 may include spring clips or any other suitable reversible latching mechanism that removably fastens to a corresponding attachment point or socket on receiving component 20. In these embodiments, inserting airflow control baffle 10 into receiving component 20 may include pressing airflow control baffle 10 into receiving component 20 until the spring fasteners or other latching mechanism engages with the corresponding component of receiving component 20. Removing such a configuration of airflow control baffle 10 from receiving component 20 may include manipulating the spring fasteners (e.g., by pressing them until the fasteners disengage from the corresponding sockets) to release airflow control baffle 10 from receiving component 20, then lifting airflow control baffle 10 away from receiving component 20.

Figure 6:
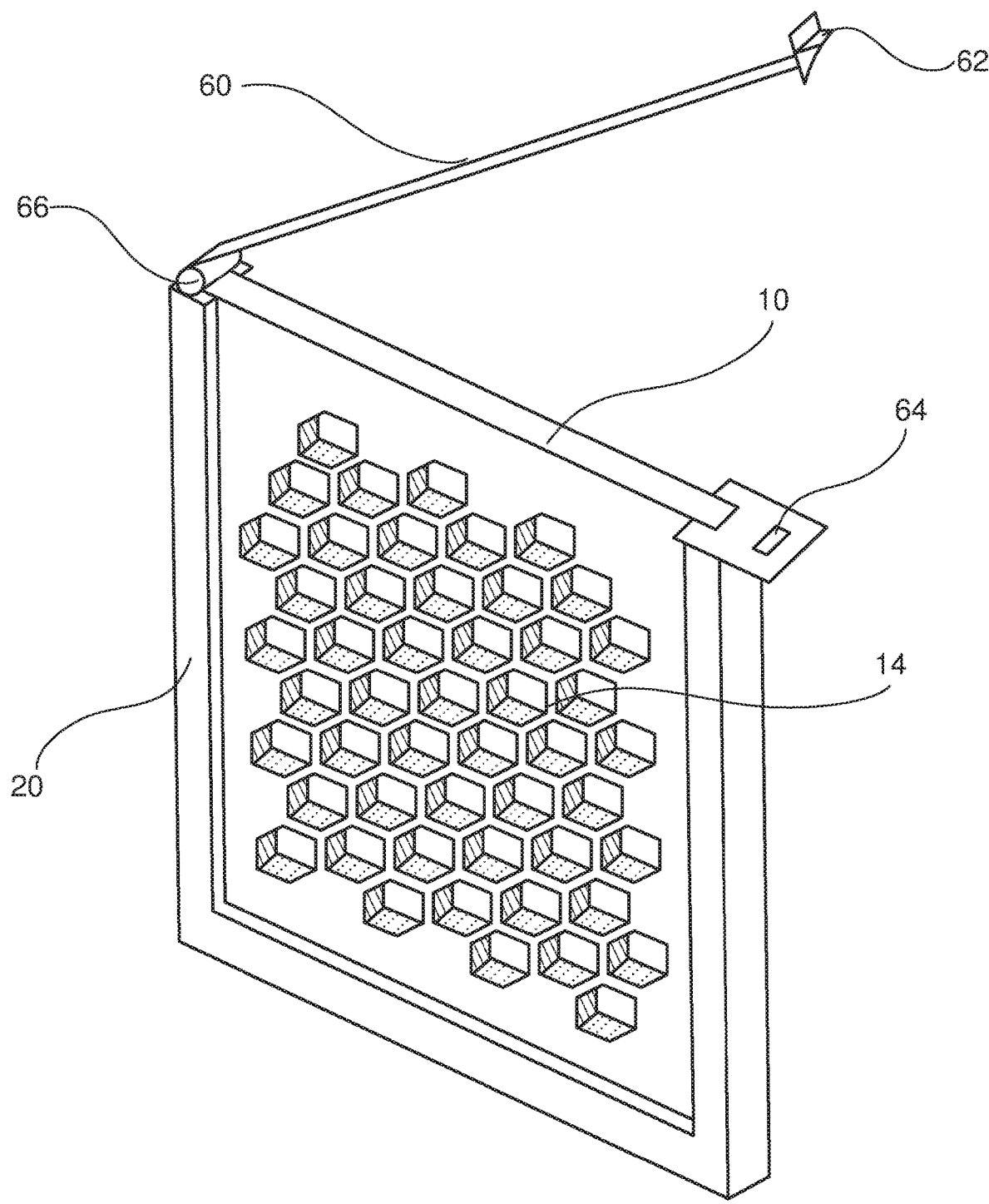
FIG. 6 is a schematic diagram of the removable airflow control baffle and receiving slot arranged as in FIG. 4, where the receiving slot includes a hinged latch cover in the open position.

Additionally or alternatively, receiving component 20 may include a cover that secures airflow control baffle 10 in place. For example, and as illustrated in FIG. 6, receiving component 20 may include a hinged latch cover that, when closed, secures airflow control baffle 10 within receiving component 20. This hinged latch cover may include a plate section 60 that physically obstructs a portion of receiving component 20 such that plate section 60 prevents airflow control baffles from being inserted into or removed from receiving component 20. Plate section 60 may be joined to receiving component 20 by a hinge 66. Hinge 66 may be located at one end of plate section 60 and allow plate section 60 to swivel about the hinge to open or close the latch cover. The latch cover may also include a latch 62 configured to removably couple to a socket 64 of receiving component 20. While the hinged latch cover is in the open position, users may be able to freely insert and/or remove airflow control baffles from receiving component 20. Users may then rotate the hinged latch cover to a closed position, thereby securing any inserted control baffle within receiving component 20.

Figure 7:
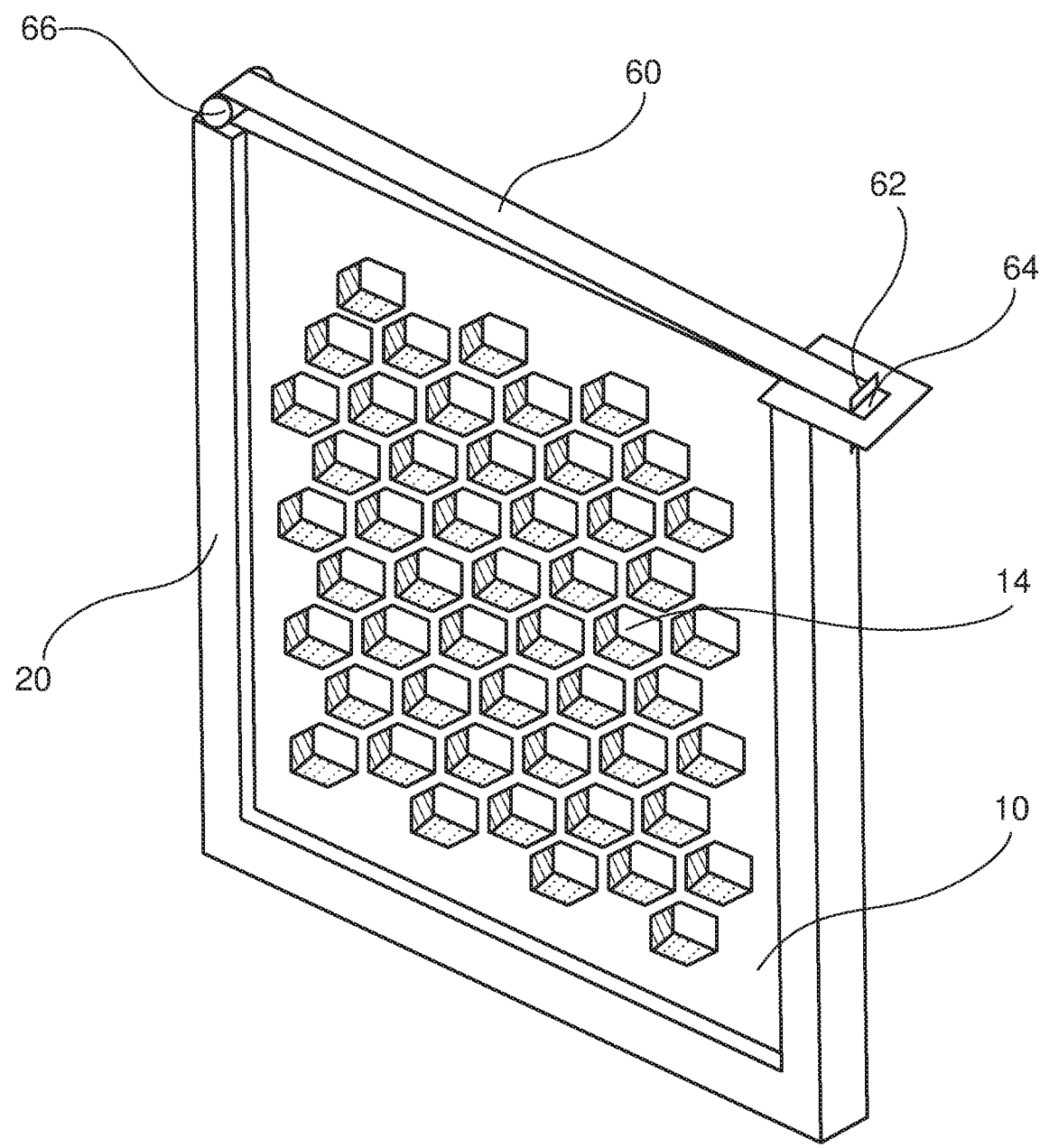
FIG. 7 is a schematic diagram of the system in FIG. 5, with the hinged latch cover in the closed position.

FIG. 7 is a schematic diagram of a system incorporating the above-described latching mechanism in a closed position. When the latch cover is in the closed position as illustrated in FIG. 7, latch 62 may removably couple to socket 64, thereby securing the latch cover in place and causing plate section 60 to secure airflow control baffle 10 in place. A user who wishes to insert a baffle into or remove a baffle from receiving component 20 may first manipulate latch 62 to decouple latch 62 from socket 64 and rotate plate section 60 to the open position. Once plate section 60 has been moved to the open position, the user may then be able to insert or remove baffles from receiving component 20.

As described above, receiving component 20 may enable airflow control baffles to affect the flow of air through an opening. Furthermore, different baffles may be configured to affect the flow of air in different ways. For example, certain baffles may be configured to permit a high volume of air to flow through opening 22. Other baffles may be configured to partially occlude opening 22 and thereby restrict the flow of air through opening 22. Further configurations of baffles may completely occlude opening 22, thereby preventing the flow of air through opening 22. Furthermore, airflow control zone 14 may include a repeating mesh pattern that is patterned to permit air to flow through airflow control zone 14. This repeating mesh pattern may be patterned in a variety of ways depending on the intended use of the corresponding baffle.

Figure 8:
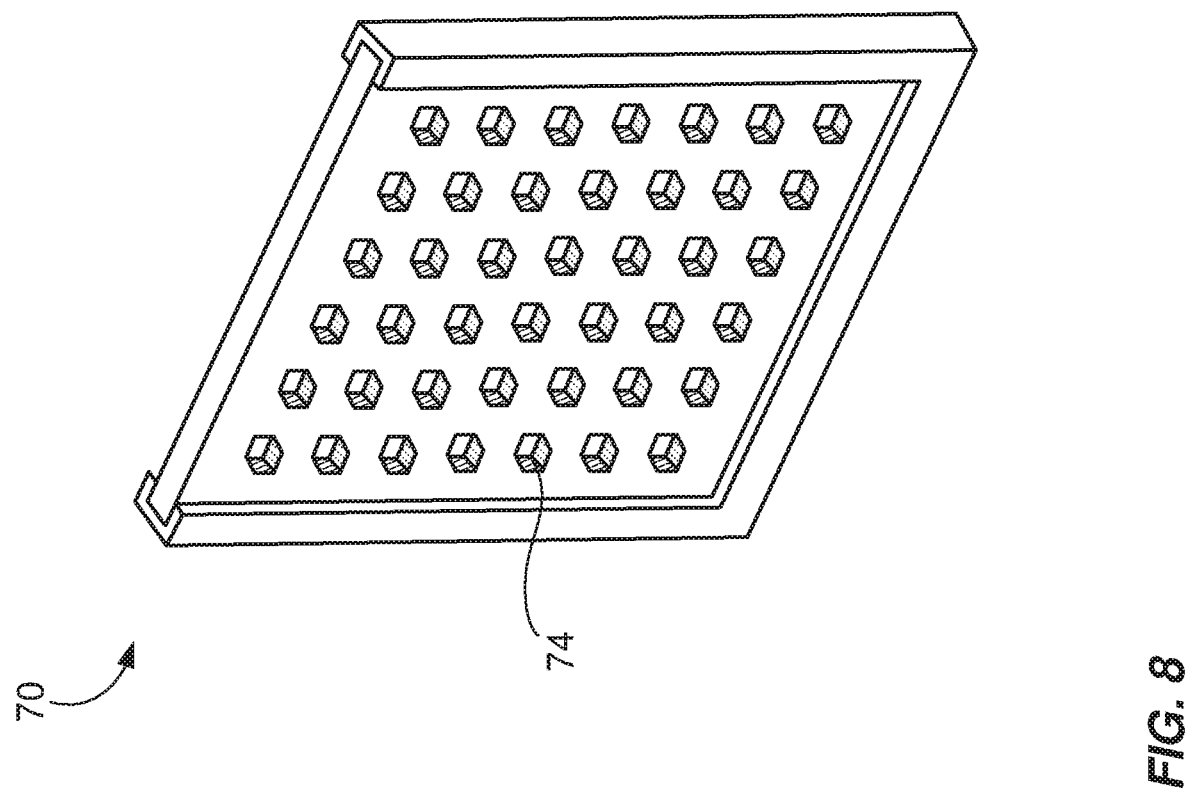
FIG. 8 is a schematic diagram comparing two different configurations of the removable airflow control baffle of FIG. 1.
Figure 8:
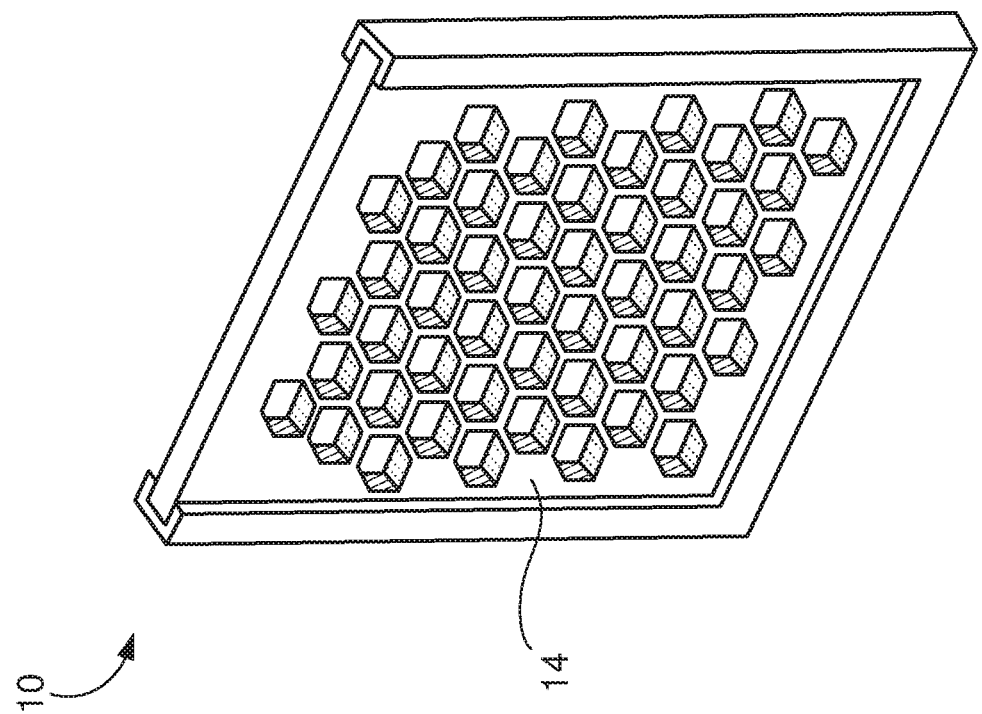

Two example airflow control baffles, each with a different configuration, are illustrated in FIG. 8. As shown in FIG. 8, airflow control baffle 10 may include airflow control zone 14 that is patterned with a mesh of a particular open ratio (and that, therefore, permits a certain amount of air to flow through airflow control zone 14). A different airflow control baffle 70 that is intended for a different purpose may include a different airflow control zone 74 with a different, in this case smaller, open ratio. In certain embodiments, such as those when the airflow control baffle is used in proximity to electronic components, the mesh pattern may be designed to reduce electromagnetic interference.

Moreover, airflow control zone 14 may include multiple layers. For example, airflow control zone 14 may include an airflow control layer that is patterned to directly affect the flow of air through airflow control zone 14. Airflow control zone 14 may also include other layers, such as a filtering layer that filters air passing through airflow control zone 14. Embodiments in which airflow control baffles are used to affect airflow across sensitive objects such as electronics may utilize such a filtering layer to minimize dust buildup that might otherwise interfere with proper operation and/or storage of the sensitive objects. These layers may be stacked such that air must pass through each layer before passing to the other side of the airflow control baffle.

Other variants of airflow control zones may exist beyond the examples illustrated here. For example, a vendor may produce baffles with various mesh patterns, open ratios, etc. Vendors may also vary the size, shape, and/or positioning of airflow control zone 14 within an airflow control baffle. End users may then exchange these airflow control baffles within the receiving components of a chassis (e.g., the structural framework of a ventilated drawer) to convert the chassis from one interior airflow pattern to another. The exact configuration of airflow control baffles used may depend on the intended use case of the chassis. For example, a data-storage center may configure a chassis intended for warm storage using one arrangement of airflow control baffles within a chassis, and configure a chassis intended for cold storage using a different arrangement of airflow control baffles.

Figure 9:
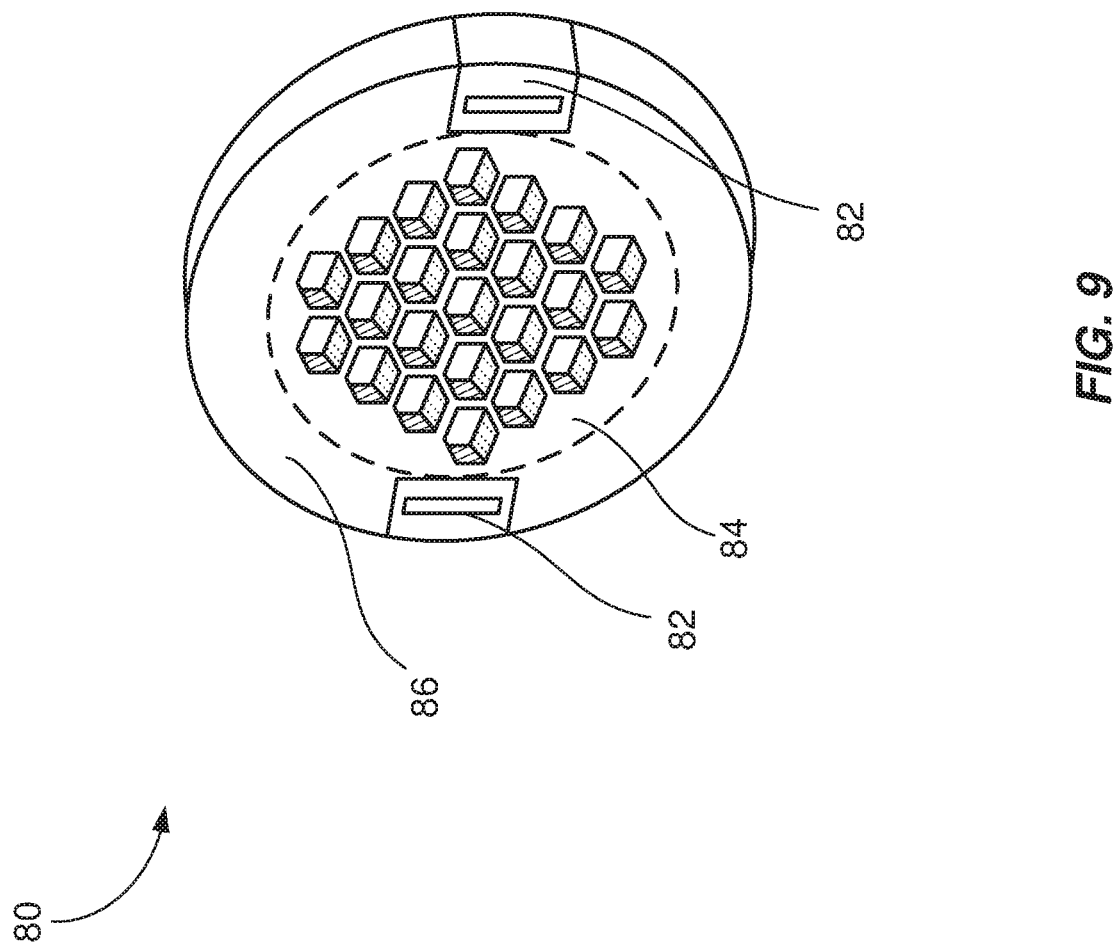
FIG. 9 is a schematic diagram of a disc-shaped airflow control baffle.

While the above-described examples focus on a rectangular airflow control baffle that is inserted into a slot-like receiving component, airflow control baffles may take a variety of forms and be coupled to receiving components in a variety of ways. An additional example of an airflow control baffle is illustrated in FIG. 9. As shown in FIG. 9, airflow control baffle 80 may be formed in the shape of a circle, with a circular-shaped airflow control zone 84 supported by a support frame 86. Airflow control baffle 80 may, in general, be designed to be pressed against a receiving component to couple airflow control baffle 80 to the receiving component. To facilitate this attachment, airflow control baffle 80 may include fasteners 82. The example of airflow control baffle 80 includes two instances of fastener 82 positioned on opposite sides of the circle from each other. As will be described in further detail below, fasteners 82 may attach to corresponding sockets on a receiving component when airflow control baffle 80 is pressed against the receiving component such that fasteners 82 are aligned with the corresponding sockets. In some embodiments, fasteners 82 may include a set of spring clips that disengage from their corresponding sockets when pressed towards the center of airflow control baffle 80.

Figure 10:
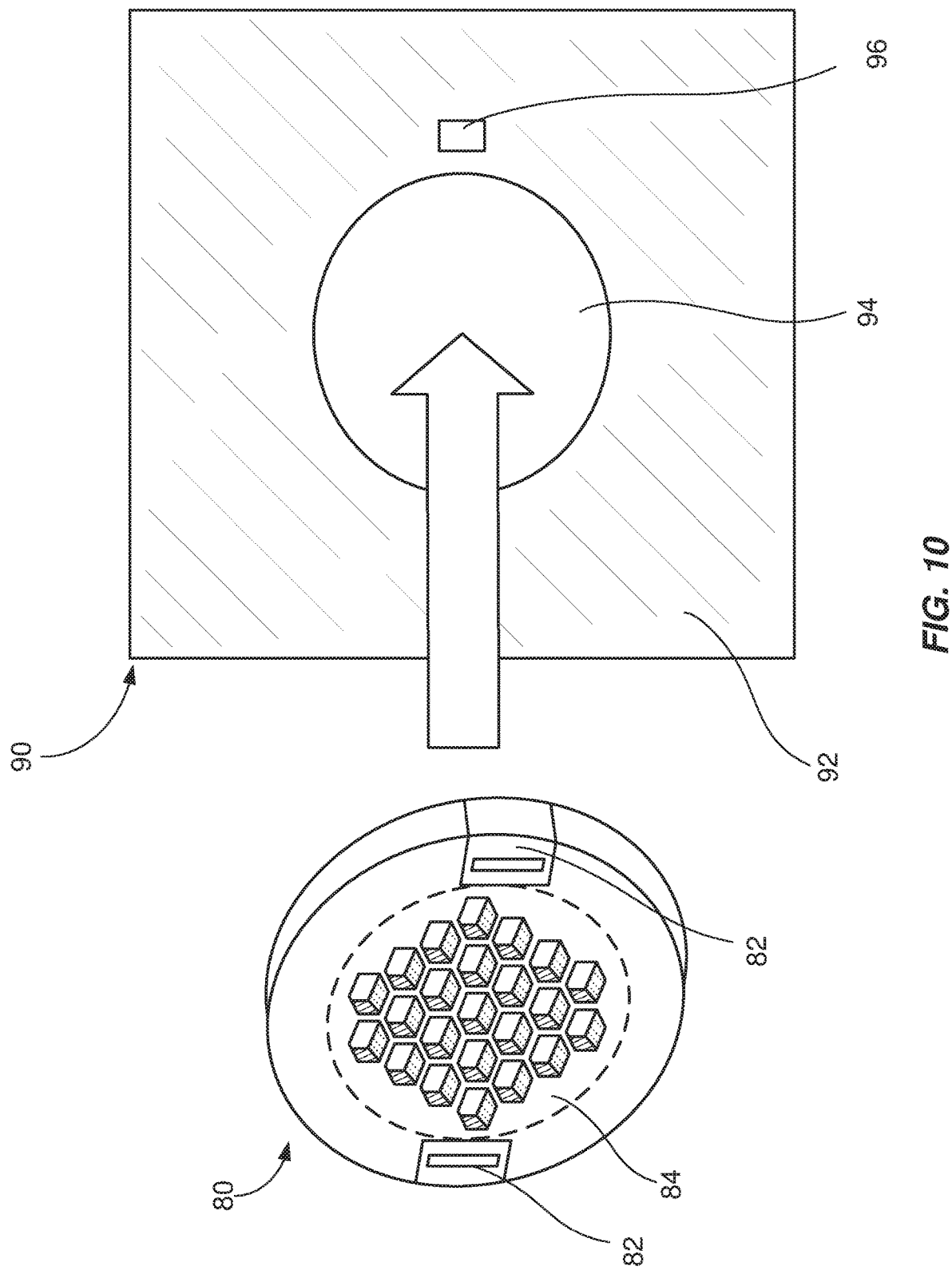
FIG. 10 is a schematic diagram of the disc-shaped airflow control baffle of FIG. 8 positioned to be coupled to a corresponding receiving component.

FIG. 10 is an illustrated example of airflow control baffle 80 positioned for attachment to a receiving component 90. Receiving component 90 may include a structural support 92 that defines an opening 94 that permits air to flow through receiving component 90. Receiving component 90 may also include at least one fastener socket 96 that is dimensioned to receive and removably couple to fasteners 82, thereby securing airflow control baffle 80 to receiving component 90. Each fastener socket 96 may be positioned such that when fastener 82 is coupled to a corresponding fastener socket 96, airflow control zone 84 is held in place over opening 94, thereby causing airflow control zone 84 to affect the flow of air through opening 94. A user may couple airflow control baffle 80 to receiving component 90 by pressing airflow control baffle 80 in the direction of the large arrow until each fastener 82 couples to the corresponding fastener socket 96.

In some embodiments, airflow control baffle 80 may include cushioning materials, sealing materials, and the like on the surface of support frame 86 intended to be proximal to structural support 92. In other words, the cushion or sealing material may be sandwiched between airflow control baffle 80 and structural support 92 when airflow control baffle 80 is fastened to structural support 92. Examples of these materials are provided in greater detail above in connection with material 50.

Figure 11:
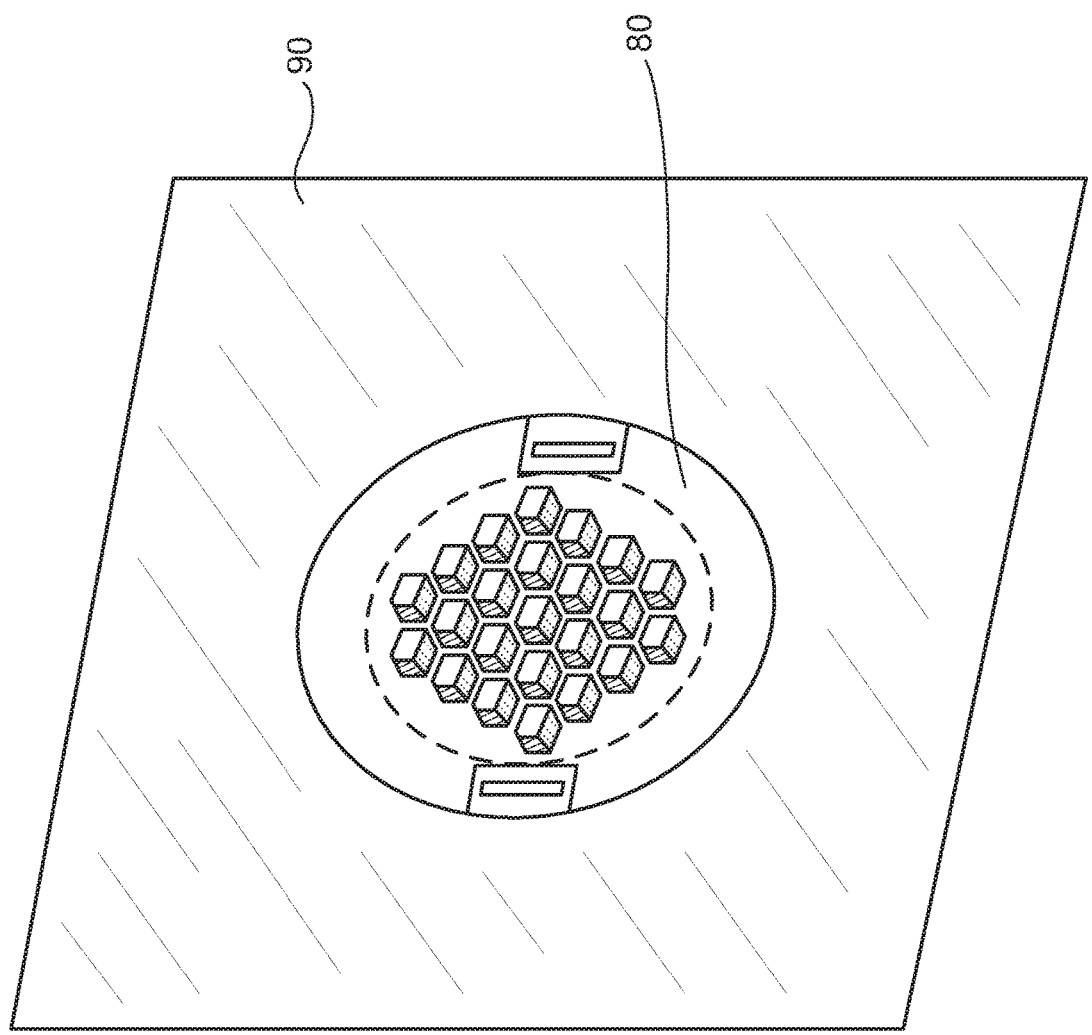
FIG. 11 is a schematic diagram of the disc-shaped baffle and receiving component of FIG. 9, with the disc-shaped baffle coupled to the receiving component.

FIG. 11 is an illustrated example of airflow control baffle 80 coupled to receiving component 90. As shown in FIG. 11, opening 94 (illustrated in FIG. 10) or receiving component 90 is completely covered by airflow control baffle 80, thus enabling airflow control baffle 80 to affect the flow of air through opening 94.

Although receiving component 90 is illustrated in the above examples as a standalone component, receiving component 90 may be integrated into another object. For example, structural support 92 may represent a portion of a wall of an enclosed container or chassis that includes opening 94 and two instances of fastener socket 96. A user may couple airflow control baffle 80 to the wall by pressing airflow control baffle 80 against the wall until the fasteners of airflow control baffle 80 couple to the corresponding fastener sockets integrated into the wall.

Figure 12:
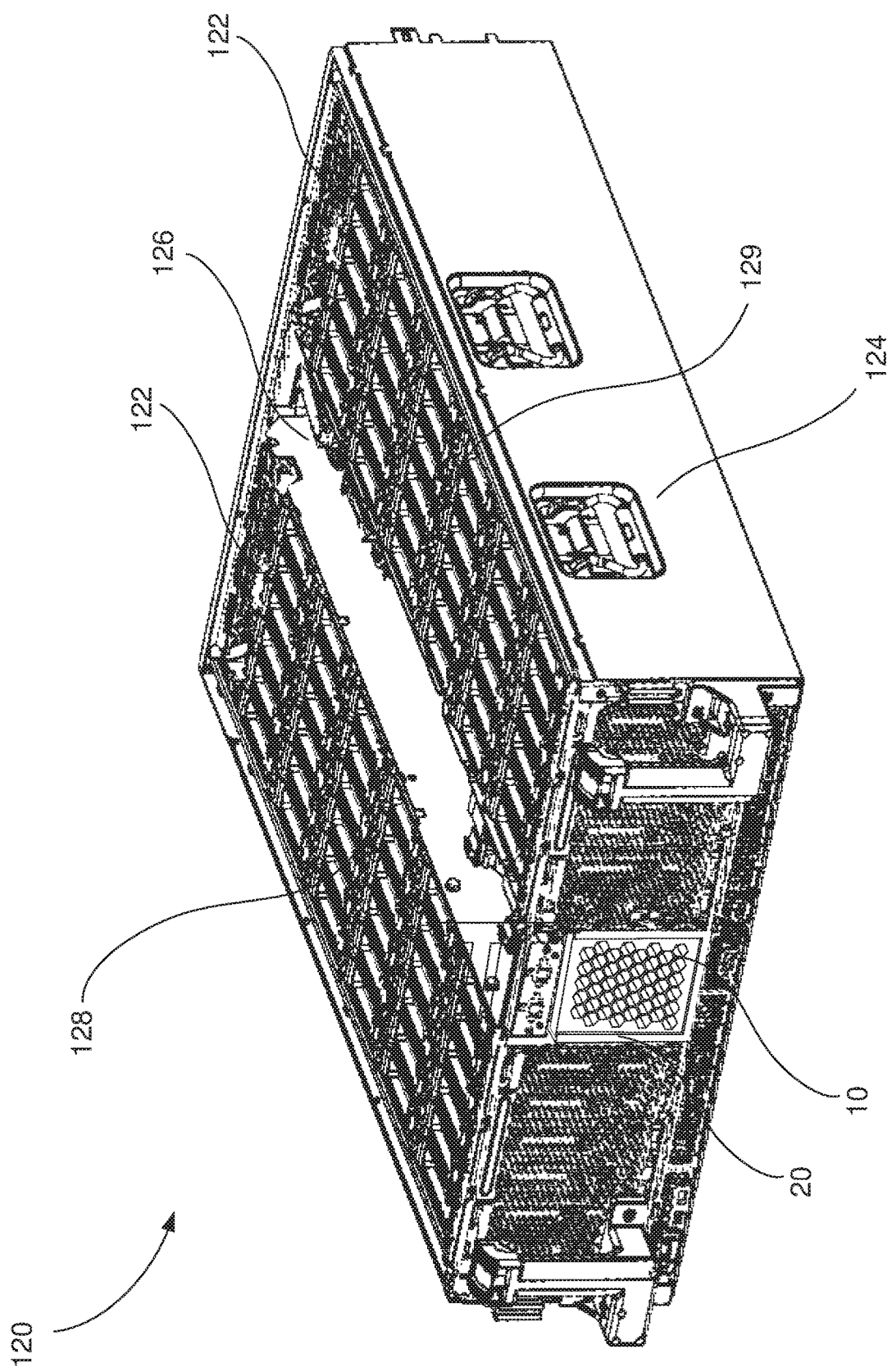
FIG. 12 is a schematic diagram of a ventilated drawer that includes a removable airflow control baffle.

As described briefly above, airflow control baffles may be incorporated into the chassis of a ventilated drawer. FIG. 12 is a schematic diagram of an example ventilated drawer 120 that utilizes airflow control baffle 10 to control the flow of air through the front of a chassis 124. In some examples, chassis 124 may include fans 122 at the rear of ventilated drawer 120 that move air through the interior of ventilated drawer 120.

Chassis 124 may also be coupled to receiving component 20 that holds airflow control baffle 10, each of which are described in greater detail above. Furthermore, chassis 124 may include an opening that corresponds to the opening defined by receiving component 20, positioned such that airflow control baffles inserted into receiving component 20 affect the flow of air through the corresponding opening in chassis 124. In other words, airflow control baffle 10 may be positioned to affect the flow of air between the interior of ventilated drawer 120 and the exterior of ventilated drawer 120.

The interior of ventilated drawer 120 may be divided into interior compartments. In the example of FIG. 12, ventilated drawer 120 is configured to hold and power an array of hard drive disks (HDDs) that are used for data storage. Ventilated drawer 120 may also be configured to simultaneously hold and power control electronics such as printed circuit boards (PCBs), microprocessors, heat sinks, and other electronics that manage the array of HDDs. The interior of ventilated drawer 120 may contain separate compartments for the HDDS and control electronics, and airflow between these compartments and/or between a given compartment and the exterior of ventilated drawer 120 may be controlled by airflow control baffles. In the example of FIG. 12, the HDDs may be stored in drive storage bays 128 and 129, while the control electronics are stored in center section 126. This arrangement may allow airflow control baffles positioned throughout chassis 124 (e.g., airflow control baffle 10 at the front of chassis 124) to control the flow of air through each individual compartment. Although only a single removable airflow control baffle is illustrated at the front of chassis 124, various embodiments of the systems described herein may include removable airflow control baffles at any suitable location within chassis 124. For example, drive storage bay 128, drive storage bay 129, and center section 126 may each be equipped with a corresponding airflow control baffle on the front face of chassis 124. Other removable airflow control baffles may be placed on walls between these compartments, at the rear of a compartment, or at any other location within chassis 124 that may be used to reconfigure the flow of air through the interior of ventilated drawer 120. Furthermore, these removable airflow control baffles may operate in conjunction with fixed baffles or other openings in chassis 124 to ensure proper airflow throughout the interior of ventilated drawer 120.

Changing the airflow control baffles installed in the various receiving components may alter the overall configuration of ventilated drawer 120. For example, a "warm" data-storage configuration of HDDs and control electronics may require different airflow through a particular aperture (e.g., the front center aperture of chassis 124) than a "cold" data-storage configuration. Receiving component 20 may be placed in front of and/or incorporated into this aperture to hold airflow control baffle 10 such that airflow control baffle 10 affects the flow of air through the aperture. Maintenance technicians and/or other users may then be able to quickly and efficiently reconfigure ventilated drawer 120 between "warm" data-storage configurations and "cold" data-storage configurations by removing and replacing the installed airflow control baffle.

Figure 13:
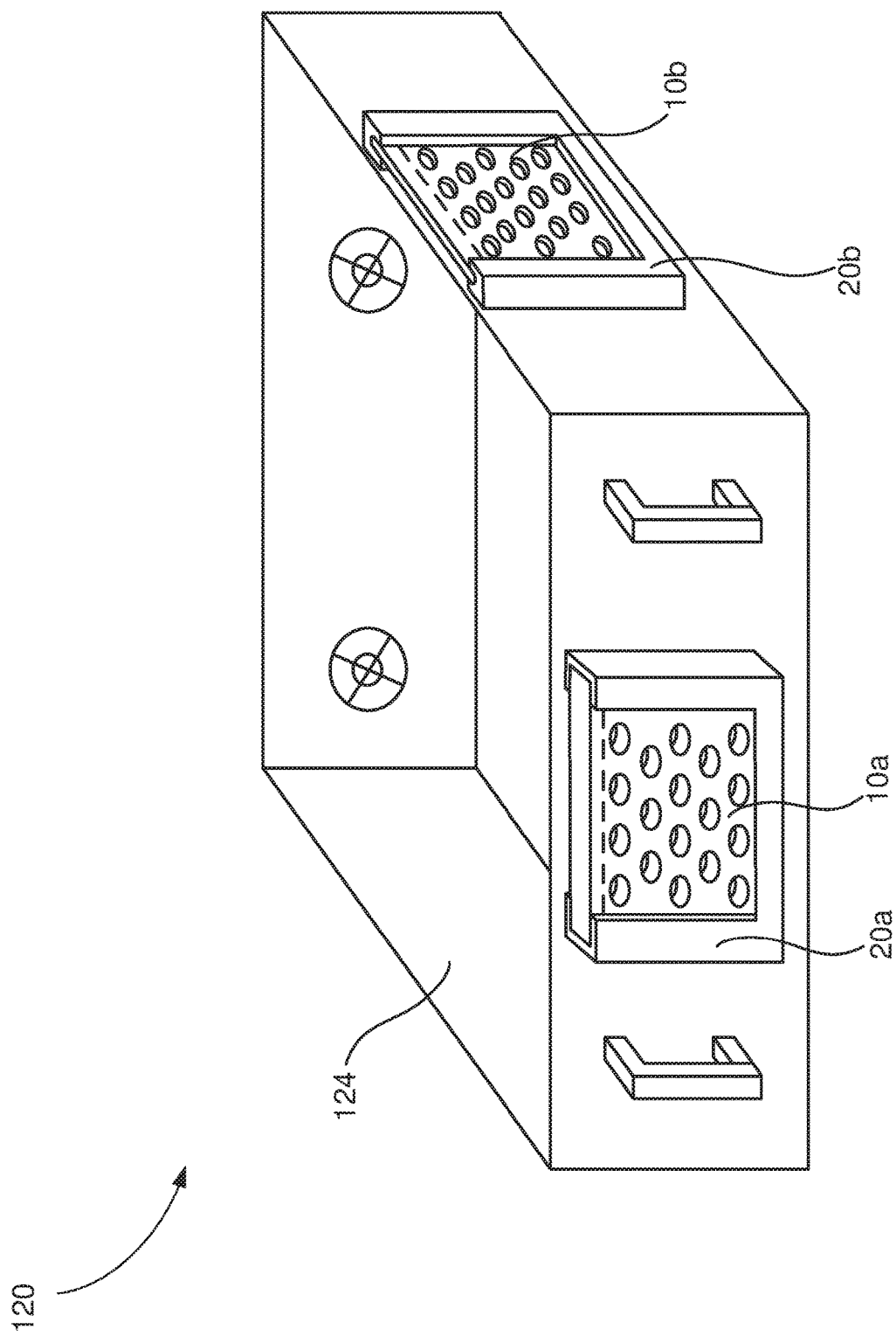
FIG. 13 is a schematic diagram of the drawer of FIG. 12, with an additional airflow control baffle placed at the side of the drawer.

As described above, ventilated drawers may incorporate multiple airflow control baffles throughout a chassis. An illustration of an example ventilated drawer that incorporates multiple airflow control baffles is shown in FIG. 13. As illustrated in FIG. 13, chassis 124 of ventilated drawer 120 may include a receiving component 20a fitted with an airflow control baffle 10a on the front of chassis 124. Airflow control baffle 10a may affect the flow of air through the front of ventilated drawer 120. Ventilated drawer 120 may also include a receiving component 20b fitted with an airflow control baffle 10b on the side of chassis 124. Airflow control baffle 10b may control the flow of air through that particular side of chassis 124. As may be appreciated from the above descriptions, airflow control baffle 10a and airflow control baffle 10b may include differently configured airflow control zones from each other.

The configuration of the airflow control zone in airflow control baffle 10a and the configuration of the airflow control zone in airflow control baffle 10b may also differ depending on the intended use case of the chassis configuration. For example, airflow control baffle 10a may control airflow to a section of ventilated drawer 120 that contains electrical components that require a high volume of airflow, and therefore include an airflow control zone that permits a relatively large amount of air to flow through airflow control baffle 10a. Meanwhile, airflow control baffle 10b may control airflow to hard drives being used in a cold storage configuration where most of the drives are powered off. These drives may generate a low amount of heat, and thus require less airflow for cooling. Accordingly, airflow control baffle 10b may restrict or even block air from flowing through the side of ventilated drawer 120. The descriptions of chassis configurations provided here are merely examples; chassis 124 may include any number of airflow control baffles arranged in any suitable manner that enables users to configure chassis 124 according to their needs. For example, some embodiments may include airflow control baffles positioned within the interior of chassis 124 and/or at the rear of chassis 124 to control the flow of air between different zones of chassis 124.

Figure 14:
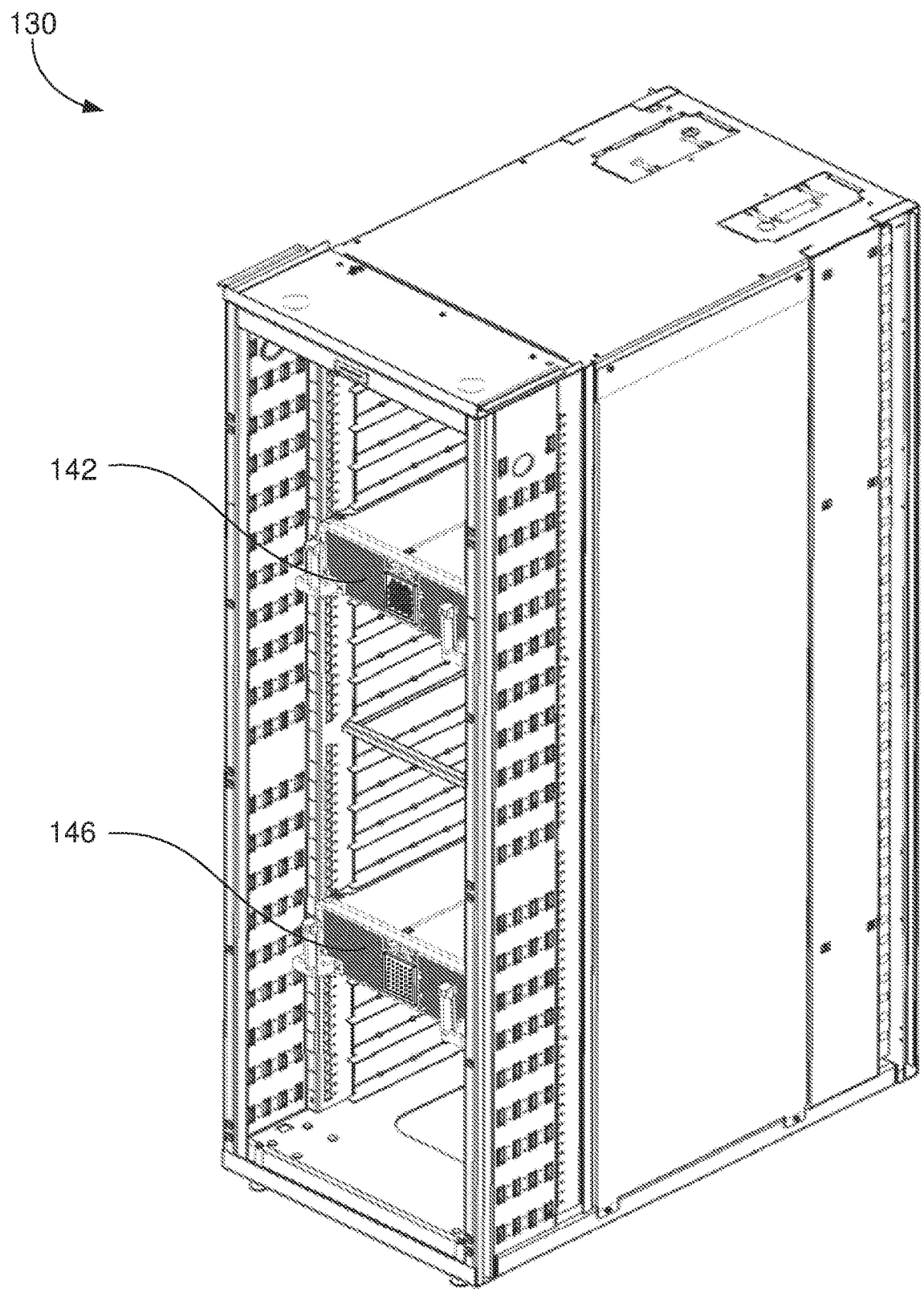
FIG. 14 is a schematic diagram of an example drawer stack that includes the drawer of FIG. 12, where each drawer is equipped with a differently configured airflow control baffle.

As described above, different ventilated drawers may include various configurations of airflow control baffles. FIG. 14 is an illustrated example of a rack 130 that includes two ventilated drawers, ventilated drawers 142 and 146. Rack 130 may represent a frame configured to support a stack of ventilated drawers that are mounted within a common frame. Rack 130 may also include various subcomponents that provide electrical power to each drawer installed in rack 130.

Each ventilated drawer may be equipped with a front-mounted receiving component and airflow control baffle in addition to any number of airflow control baffles located elsewhere within the chassis of each drawer. Moreover, each ventilated drawer may have been configured for a specific purpose. In the example of FIG. 13, ventilated drawer 142 may be configured to store an arrangement of control electronics and hard drives that requires a high volume of air flow through the front of the chassis, and accordingly be fitted with an airflow control baffle that permits a large quantity of air to flow through the front of ventilated drawer 142. Ventilated drawer 146, on the other hand, may be configured to store a different arrangement of hardware that requires a lesser amount of airflow through the front of the chassis. Ventilated drawer 146 may accordingly be fitted with an airflow control baffle that restricts the flow of air through the front of the chassis.

In the event that the administrator for rack 130 wishes to change the configuration of any of the illustrated ventilated drawers, a user may alter the airflow configuration of a ventilated drawer by removing and replacing the airflow control baffle. For example, a user may decide to remove ventilated drawer 142 from operation. The user may then reconfigure ventilated drawer 142 by removing the current airflow control baffle and replacing it with a different airflow control baffle, such as one that occludes the opening in the front of ventilated drawer 142. Similarly, a user may decide to convert ventilated drawer 146 from its current use that requires lower airflow to a different use that requires more airflow. The user may then remove the low-airflow baffle from the front of ventilated drawer 146 and replace it with an airflow control baffle that permits an increased volume of air to flow through the front of ventilated drawer 144.

In some embodiments, various visual features incorporated into airflow control baffles, receiving components, and/or ventilated drawers may enable automated systems to exchange airflow control baffles installed in a ventilated drawer, thereby enabling automated construction, configuration and/or reconfiguration of the ventilated drawer. For example, a collection of airflow control baffles may be colored and/or barcoded to indicate the configuration of each baffle. Additionally or alternatively, airflow control baffles may incorporate radio tags, such as RFID tags, that allow devices to "read" the configuration of the airflow control baffle. The airflow control baffles may also include other indicators that enable an automated system to "read" the correct orientation in which to install the airflow control baffle into a corresponding receiving component. Receiving components of a chassis may similarly include colors, barcodes, beacons, RFID tags, and/or other machine-identifiable features indicating the position of the receiving component and its purpose within the chassis. For example, a receiving component may include patterned segments that indicate both the purpose (e.g., front ventilation) and the orientation of the receiving component. Automated systems such as robotic drones may leverage these features to construct and configure a ventilated drawer with little or no manual intervention.

Similarly, an administrator may direct an automated system to reconfigure a particular ventilated drawer. The automated system may then use features of the installed airflow control baffles, receiving components, and chassis to remove the installed airflow control baffles and replace them with airflow control baffles appropriate for the new configuration.

As described in greater detail above, the described apparatuses, systems, and methods may allow users and/or administrators to quickly and efficiently alter the airflow configuration of a ventilated drawer by exchanging removable airflow control baffles placed at strategic points throughout the chassis of the drawer. Enabling users and/or administrators to quickly alter the configuration of a ventilated drawer in this manner may reduce spare part inventory, reduce maintenance and/or setup time of systems that use ventilated drawers, and/or allow for in-place upgrades and/or modifications to ventilated drawer hardware. Moreover, various features of the described apparatuses, systems, and methods may enable automated construction, configuration, and/or reconfiguration of ventilated drawer hardware.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
    first airflow control baffle configured to be removably coupled to a receiving component that facilitates a flow of air through an enclosed container, the first airflow control baffle having a first airflow control zone that affects airflow through an opening defined by the receiving component and having an indicator corresponding to an airflow characteristic of the first airflow control zone;
    a second airflow control baffle configured to be removably coupled to the receiving component that facilitates the flow of air through the enclosed container, the second airflow control baffle having a second airflow control zone that affects airflow through the opening defined by the receiving component and having an indicator corresponding to an airflow characteristic of the second airflow control zone, wherein the second airflow control zone is different than the first airflow control zone;
    a first support frame that is configured to removably couple the first airflow control zone to the receiving component;
    a second support frame that is configured to removably couple the second airflow control zone to the receiving component;
    a ventilated drawer that permits airflow through the interior of the enclosed container; and
    the receiving component is coupled to the ventilated drawer and facilitates airflow through the interior of the ventilated drawer, wherein the receiving component:
        defines a single airflow opening that permits air to flow through the receiving component;
        is configured to receive the first or the second airflow control baffle such that the first or the second airflow control baffle is positioned to affect the flow of air through the airflow opening; and
        is configured to receive the first or the second airflow control baffle without the ventilated drawer being removed from a support rack that holds a plurality of ventilated drawers.

2. The system of claim 1, wherein the first airflow control baffle comprises a colored material that forms the first support frame and the first airflow control zone, the color of the colored material being associated with a configuration of the first airflow control zone.

3. The system of claim 1, wherein the receiving component comprises a receiving slot that is configured to define the opening and is configured to removably hold the first or the second airflow control baffle within the opening.

4. The system of claim 3, wherein:
    the receiving slot defines an opening that is substantially rectangular in shape; and
    the first support frame forms a substantially rectangular shape that enables the first airflow control baffle to be removably inserted into the receiving slot.

5. The system of claim 1, wherein the first airflow control zone comprises a repeating mesh pattern that is patterned to permit air to flow through the first airflow control zone.

6. The system of claim 5, wherein the repeating mesh pattern is patterned to reduce electromagnetic interference caused by the first airflow control baffle.

7. The system of claim 1, wherein:
    the receiving component comprises at least one spring clip socket; and
    the first support frame comprises at least one spring clip that removably couples to the spring clip socket.

8. The system of claim 1, wherein the first airflow control zone partially occludes the opening defined by the receiving component, thereby restricting airflow through the opening defined by the receiving component.

9. The system of claim 1, further comprising a cushioning material that:
is coupled to the first support frame; and
cushions the first airflow control baffle against contact with the receiving component.

10. The system of claim 1, further comprising a sealing material that forms a seal between the first support frame and the receiving component while the first airflow control baffle is coupled to the receiving component.

11. The system of claim 1, wherein the indicator corresponding to an airflow characteristic of the first airflow control zone is a machine-identifiable feature that differentiates a configuration of the first airflow control zone from a configuration of the second airflow control zone.

12. The system of claim 1, wherein the first airflow control baffle is configured to provide airflow to an array of hard drives.

13. The system of claim 1, wherein the first airflow control baffle is configured to provide airflow to control electronics.

14. The system of claim 13, wherein:
the control electronics support a warmer data-storage configuration; and
the first airflow control baffle is configured to provide airflow corresponding to a warmer data-storage configuration.

15. The system of claim 13, wherein:
the control electronics support a cooler data-storage configuration; and
the first airflow control baffle is configured to provide airflow corresponding to a cooler data-storage configuration.

16. The system of claim 1, wherein the first airflow control baffle comprises a machine-readable radio tag that enables identification of a configuration of the first airflow control zone.

17. The system of claim 2, wherein:
the colored material comprises a blue color; and
the first airflow control zone comprises a colder zone.

18. The system of claim 2, wherein:
the colored material comprises an orange color; and
the first airflow control zone comprises a warmer zone.

19. The system of claim 11, wherein the machine-identifiable feature is a color.

20. The system of claim 11, wherein the machine-identifiable feature is a barcode or a pattern.

* * * * *